(12) United States Patent
Sultenfuss et al.

(10) Patent No.: US 9,301,393 B2
(45) Date of Patent: Mar. 29, 2016

(54) SYSTEM AND METHOD FOR A HIGH RETENTION MODULE INTERFACE

(71) Applicant: Dell Products, LP, Round Rock, TX (US)

(72) Inventors: Andrew T. Sultenfuss, Leander, TX (US); Thomas G. Noonan, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 0 days.

(21) Appl. No.: 14/492,858

(22) Filed: Sep. 22, 2014

(65) Prior Publication Data

US 2015/0009643 A1 Jan. 8, 2015

Related U.S. Application Data

(63) Continuation of application No. 13/219,237, filed on Aug. 26, 2011, now Pat. No. 8,867,223.

(51) Int. Cl.
| | |
|---|---|
| *H05K 7/00* | (2006.01) |
| *H05K 1/16* | (2006.01) |
| *H05K 1/11* | (2006.01) |
| *H01L 23/00* | (2006.01) |
| *H05K 7/14* | (2006.01) |
| *H01Q 1/12* | (2006.01) |
| *H05K 1/02* | (2006.01) |
| *H05K 13/00* | (2006.01) |

(52) U.S. Cl.
CPC ............... *H05K 1/11* (2013.01); *H01L 23/562* (2013.01); *H01Q 1/12* (2013.01); *H05K 1/0213* (2013.01); *H05K 7/14* (2013.01); *H05K 13/0023* (2013.01); *H01L 2224/11* (2013.01); *H01L 2924/0002* (2013.01); *Y10T 29/49016* (2015.01)

(58) Field of Classification Search
None
See application file for complete search history.

(56) References Cited

U.S. PATENT DOCUMENTS

| | | |
|---|---|---|
| 3,484,697 A | 12/1969 | Abend |
| 7,493,690 B2 | 2/2009 | Muto et al. |
| 7,764,246 B2 | 7/2010 | Yu et al. |
| 8,319,114 B2 | 11/2012 | Cheng et al. |
| 2002/0025099 A1 | 2/2002 | Williams et al. |
| 2002/0030248 A1 | 3/2002 | Sato et al. |
| 2002/0195721 A1 | 12/2002 | Lee et al. |
| 2003/0139030 A1 | 7/2003 | Grigg |
| 2004/0032022 A1 | 2/2004 | Ding |
| 2004/0087077 A1 | 5/2004 | Farnworth et al. |
| 2005/0077080 A1 | 4/2005 | Dairo et al. |
| 2005/0077545 A1 | 4/2005 | Zhao et al. |
| 2005/0156314 A1 | 7/2005 | Grigg |
| 2005/0178815 A1 | 8/2005 | Blood |
| 2008/0068816 A1 | 3/2008 | Han et al. |
| 2009/0057896 A1 | 3/2009 | Su |
| 2010/0052151 A1 | 3/2010 | Zhao et al. |
| 2011/0079896 A1 | 4/2011 | Satoh et al. |
| 2013/0050976 A1 | 2/2013 | Sultenfuss et al. |

*Primary Examiner* — Dion R Ferguson
(74) *Attorney, Agent, or Firm* — Larson Newman, LLP

(57) ABSTRACT

A device includes a substrate, a first antenna connection, and a first retention mechanism. The substrate has a top surface and a bottom surface. The first antenna connection is mounted directly to the top surface of the substrate, and is configured to connect with a first antenna. The first retention mechanism is connected at a first location of the bottom surface of the substrate to provide support for the substrate at the first antenna connection when the first antenna connection is connected to the first antenna. The first location of the first retention mechanism is selected to be directly below the first antenna connection.

20 Claims, 5 Drawing Sheets

SYSTEM AND METHOD FOR A HIGH RETENTION MODULE INTERFACE

CROSS REFERENCE TO RELATED APPLICATIONS

This application is a continuation of U.S. patent application Ser. No. 13/219,237, entitled "System and Method for a High Retention Module Interface," filed on Aug. 26, 2011, the disclosure of which is hereby expressly incorporated by reference in its entirety.

FIELD OF THE DISCLOSURE

This disclosure generally relates to information handling systems, and more particularly relates to a system and method for a high retention module interface.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

An information handling system, such as a wireless device, can include a radio module to enable the wireless device to transmit and receive data. The radio module can be a minicard or a modular solder down radio, which can be attached to a mother board of the wireless device. The radio module can be soldered to the mother board to provide high retention of the radio module to the mother board. The radio module may also have an antenna that can be connected to the radio module during a manufacturing process of the module.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
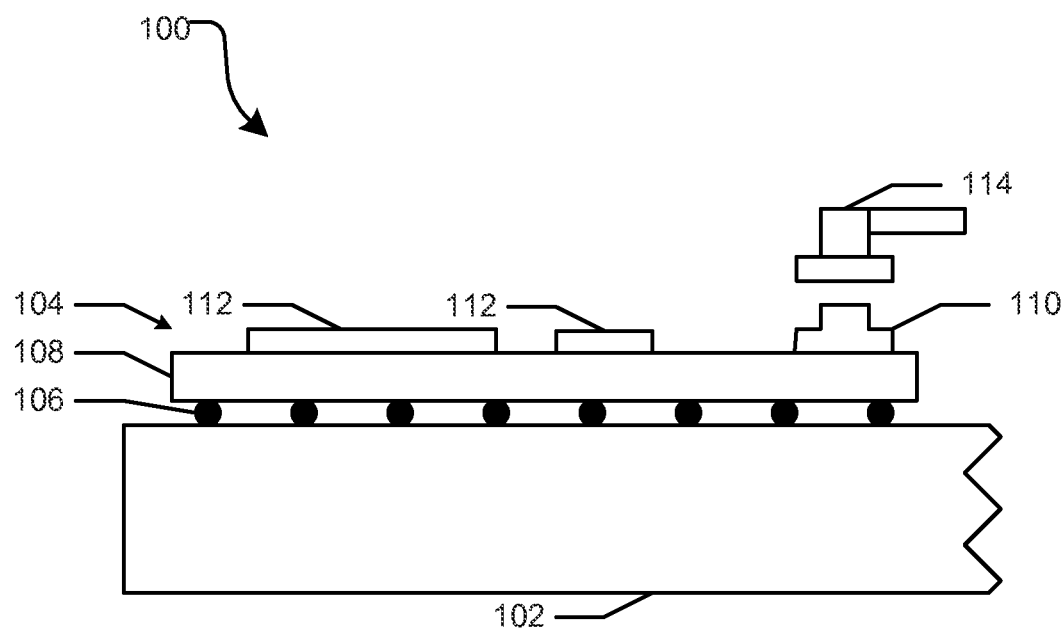
FIG. 1 is a diagram illustrating a communication system including a module connected to a mother board.

FIG. 1 shows a communication system 100 for an information handling system. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The communication system 100 includes a printed circuit board 102, such as a mother board, and a module 104. The printed circuit board 102 is connected to the module 104 via a number of solder tabs 106. The module 104 includes a substrate 108, an antenna connection 110, and a number of components 112. The antenna connection 110 can be connected to an antenna 114. The module 104 can be a modular radio for a wireless device, such as a laptop computer, a cellular telephone, a tablet computer, a personal digital assistant, or the like.

The solder tabs 106 can be attached to the substrate 108 of the module 104 during manufacturing of the module or can be attached directly to the printed circuit board 102. When the manufacturing of the module 104 is completed, the module can be connected to the printed circuit board 102 by heating the solder tabs 106 so that the solder tabs can fuse with and can establish an attachment to the printed circuit board. The solder tabs 106 can provide support to the substrate 108, which can have a thickness that is significantly less than a thickness of the printed circuit board 102. For example, the substrate 1108 can have a thickness of a half millimeter, the printed circuit board 102 can have a thickness of three millimeters, and the solder tabs 106 can have an thickness of three tenths of a millimeter. The solder tabs 106 can connect the substrate 1108 of the module 104 to the printed circuit board 102 in multiple locations, such that the substrate can be supported by the printed circuit board via the solder tabs. Thus, stress exerted on the substrate 108 through the substrate flexing during normal operation of the communication system 100 can pass from the substrate to the printed circuit board 102 via the solder tabs 106. The solder tabs 106 can be distributed on the substrate 108, such that the entire substrate can be supported by thicker printed circuit board 102 via the solder tabs.

The antenna connection 110 is in communication with the components 112, such that the components can utilize the antenna connection and the antenna. 114 to transmit and receive data. The module 104 can be provided as a primary radio for communication system 100 via the antenna connection 110 and the antenna 114. During the manufacturing process of the module 104, the antenna 114 can be manually connected to the antenna connection 110. For example, an individual can press the antenna 114 down onto the antenna connection 110 with a downward force until the antenna snap fits on the antenna connection. The downward force exerted on the antenna connection 110 can cause additional stress on the substrate 108 that the solder tabs 106 are not designed to support, such that the substrate may shear or fracture through communication tines running on the substrate from the antenna connection to the components 112.

Figure 2:
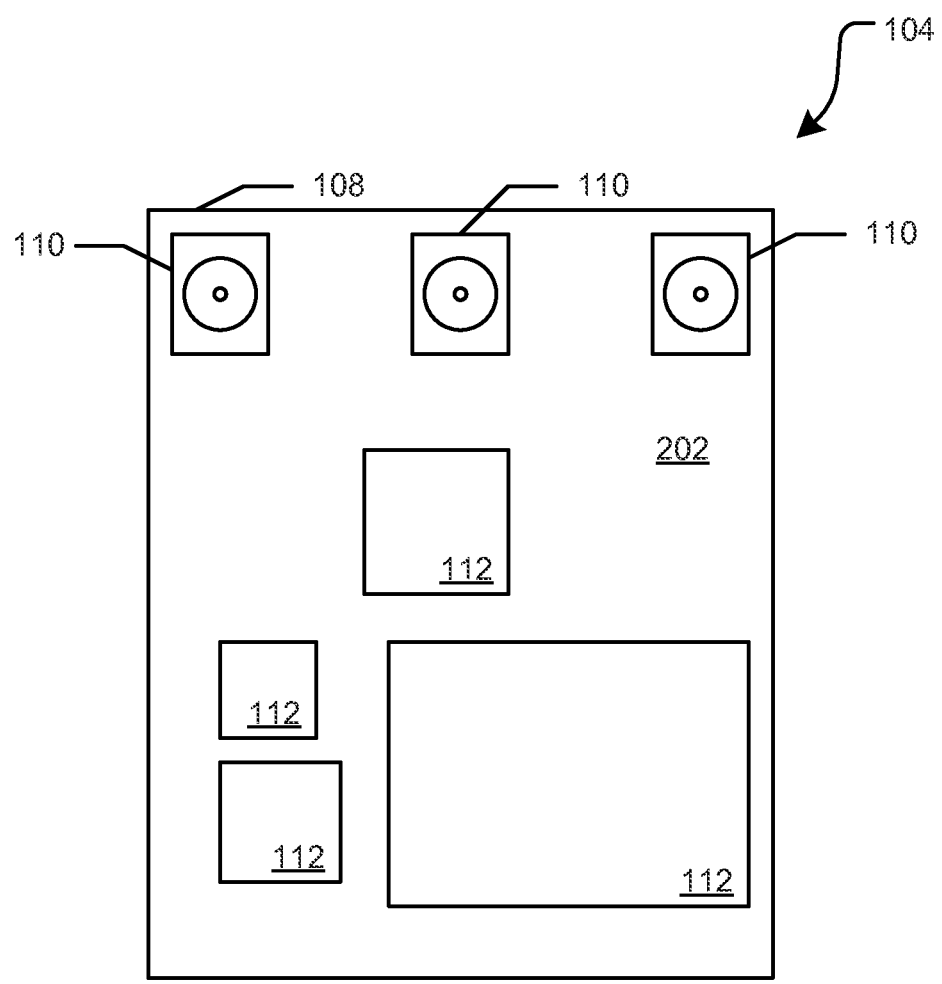
FIG. 2 is a diagram illustrating a top surface of a substrate of the module.

FIG. 2 shows the module 104 including a top surface 202 of the substrate 108, multiple antenna connections 110, and multiple components 112. Each of the antenna connections 110 can be located at a different location on the top surface 202 of the substrate 104. In an embodiment, the antenna connections 110 can be located along a single edge of the top surface 202, such that the stress applied to the substrate can be at a location that is away from the more rigid portion of the substrate where the components are located. In another embodiment, a shield cover or Faraday cover can be connected to the top surface 202 of the substrate 108 to cover and protect the components 112 but not the antenna connections 110. The shield cover can strengthen the part of the substrate 108 that is covered by the shield cover, but can cause the portion of the substrate where the antenna connections 110 are located to be affected more by the force and stress exerted on the substrate when the antennas 114 are connected to the antenna connections.

Figure 3:
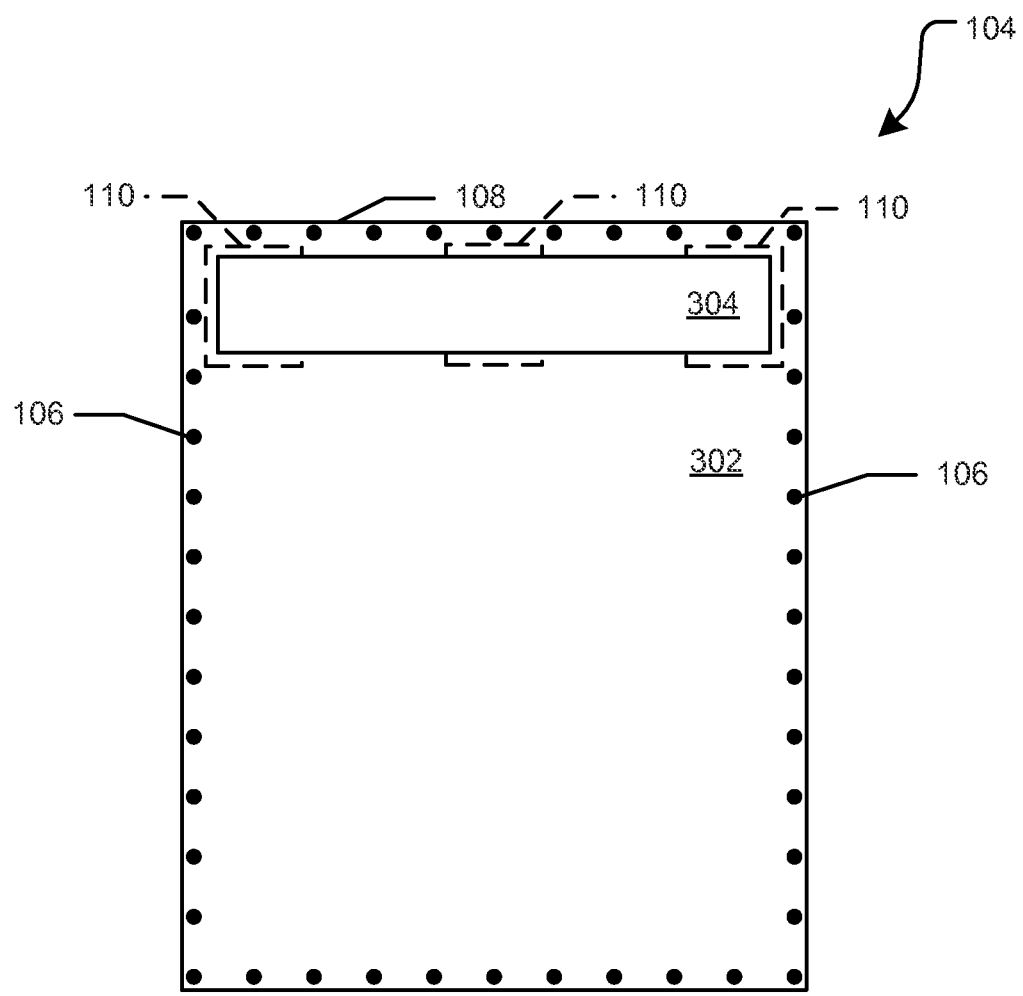
FIG. 3 is a diagram illustrating a bottom surface of the substrate of the module.

FIG. 3 shows the module 104 including a bottom surface 302 of the substrate 108, a retention mechanism 304, and the solder tabs 106. The retention mechanism 304 and the solder tabs 106 can be connected to the bottom surface 302 of the substrate 108. In an embodiment, the solder tabs 106 can be connected around an edge of the bottom surface 302 to secure the substrate 108 to the printed circuit board 102.

A location of the retention mechanism 304 can be selected so that the retention mechanism is directly below the antenna connections 110. In an embodiment, the retention mechanism 304 can be rectangular and extend along the bottom surface 302 of the substrate 108 for substantially the same distance as a distance from one of the antenna connections 110 on the top surface 202 of the substrate. The retention mechanism 304 can be a small array pattern of solder tabs, an epoxy, glue, or the like. In an embodiment, a height of the retention mechanism 304 can controlled and/or set by layering epoxy or glue to a desired height.

The retention mechanism 304 can be connected to the printed circuit board 102 in substantially the same manner as discussed above with respect to the solder tabs 106. When the module 104 is connected to the printed circuit board 102 via the solder tabs 106 and the retention mechanism 304, the retention mechanism can provide support for the substrate 108 at the locations of the antenna connections 110. Thus, when the antenna connections 110 are connected to the antennas 114, any force or stress exerted on the substrate 108 can be passed to the printed circuit board 102 via the retention mechanism 304. In an embodiment, the stress exerted on the substrate 108 when the antenna 114 is connected to the antenna contention 110 is greater than the normal stress on the substrate caused by the substrate flexing.

Figure 4:
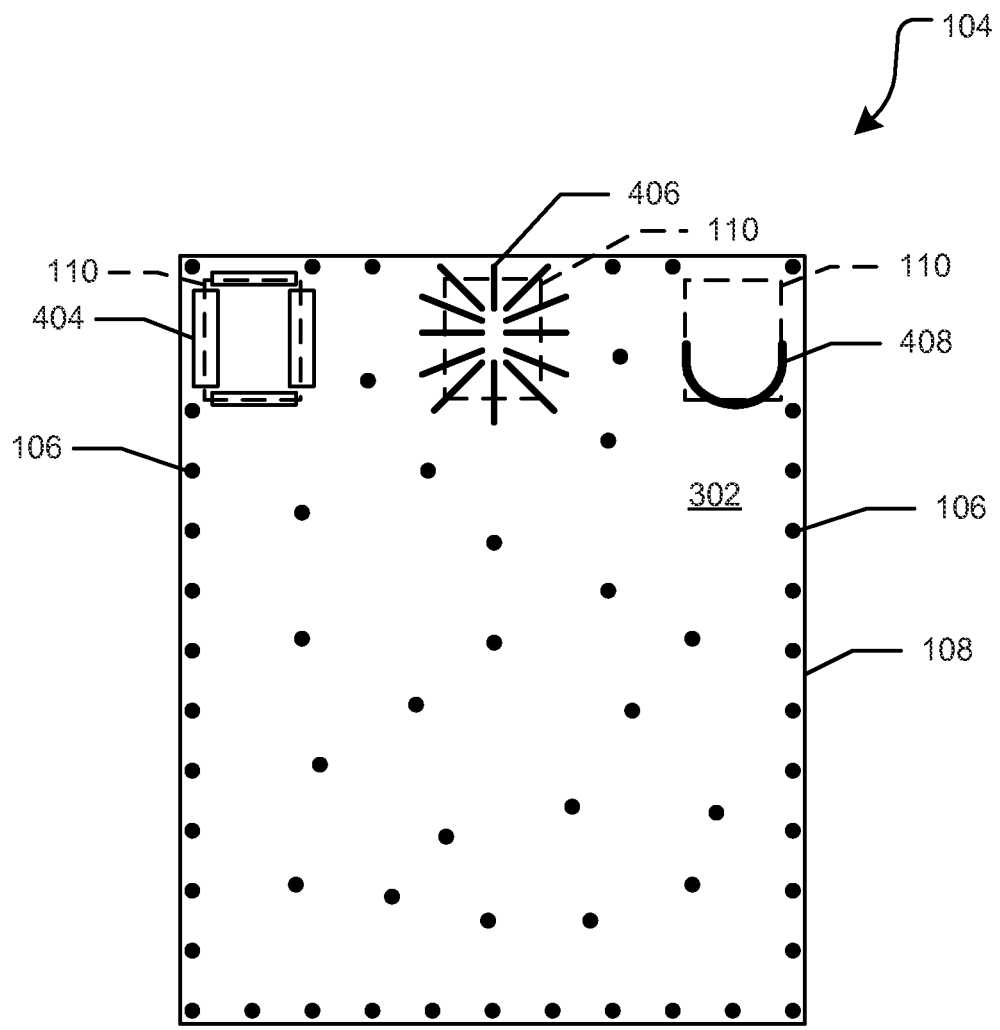
FIG. 4 is a diagram illustrating another embodiment of the bottom surface of the substrate of the module.

FIG. 4 shows the module 104 including the bottom surface 302 of the substrate 108, retention mechanisms 404, 406, and 408, and the solder tabs 106. The retention mechanisms 404, 406, and 408, and the solder tabs 106 can be connected to the bottom surface 302 of the substrate 108. The retention mechanisms 404, 406, and 408 can be a small array pattern of solder tabs, an epoxy, glue, or the like. In an embodiment, the solder tabs 106 can be connected all over the bottom surface 302 to secure the substrate 108 to the printed circuit board 102. The solder tabs 106 can be randomly or evenly distributed on the bottom surface 302.

Location of the retention mechanisms 404, 406, and 408 can be selected so that each one of the retention mechanisms is directly below a different one of the antenna connections 110. The retention mechanism 404 can be shaped such as to form an outline of one of the antenna connections 110. The retention mechanism 406 can be a star burst design and can be located on the bottom surface 302 of the substrate 108 directly below one of the antenna connections 110. The retention mechanism 408 can be a crescent shape and can be located on the bottom surface 302 of the substrate 108 directly below one of the antenna connections 110. The retention mechanisms 404, 406, and 408 can be connected to the printed circuit board 102 in substantially the same manner as discussed above with respect to the solder tabs 106. When the module 104 is connected to the printed circuit board 102 via the solder tabs 106 and the retention mechanisms 404, 406, and 408, the retention mechanisms can provide support for the substrate 108 at the locations of the antenna connections 110. Thus, when the antenna connections 110 are connected to the antennas 114, any force or stress exerted on the substrate 108 can be passed to the printed circuit board 102 via the retention mechanisms 404, 406, and 408.

Figure 5:
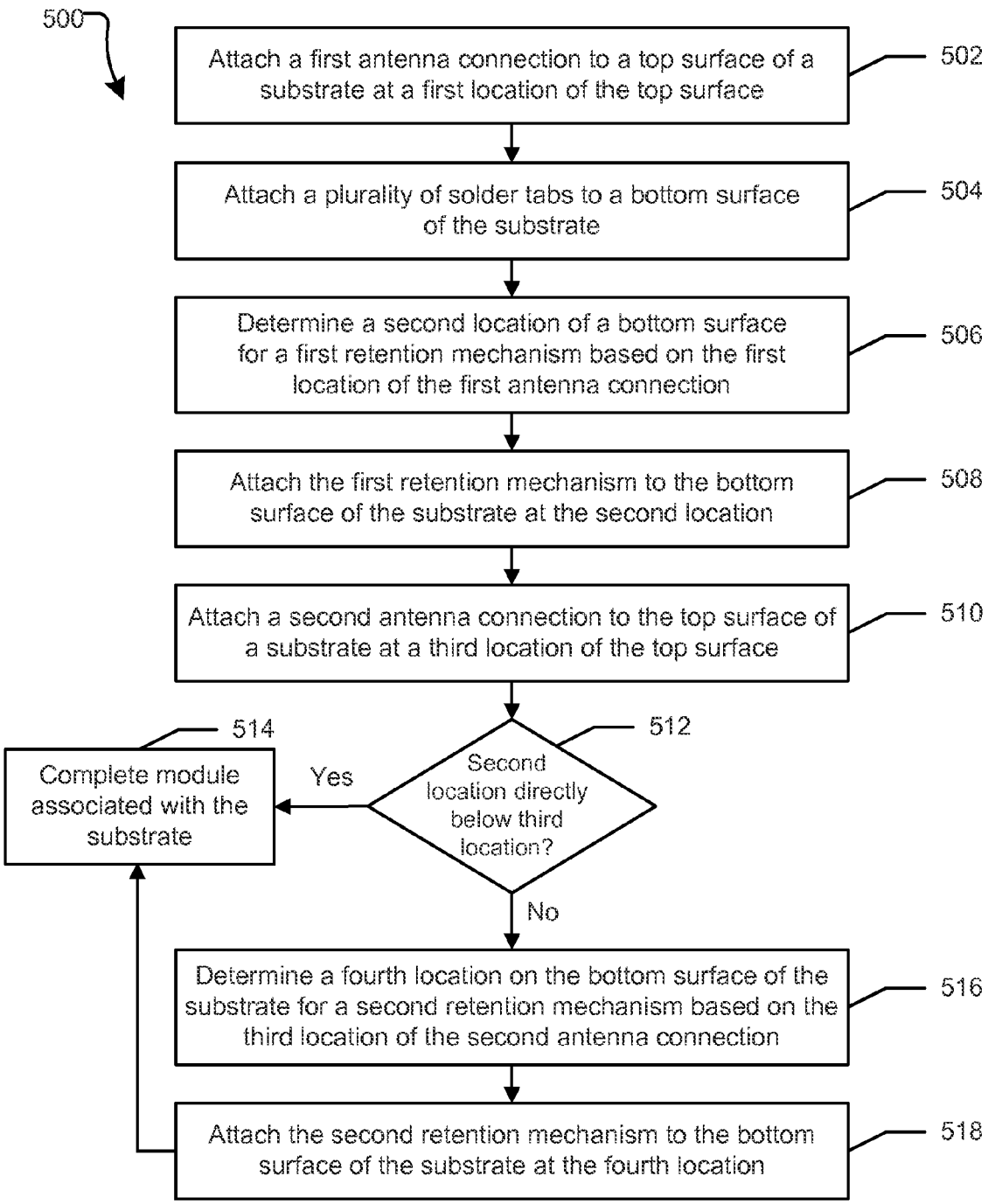
FIG. 5 is a flow diagram of a method for manufacturing a module solder down radio.

FIG. 5 shows a method 500 for manufacturing a module solder down radio. At block 502, a first antenna connection is attached to a top surface of a substrate at a first location of the top surface. A plurality of solder tabs are attached to a bottom surface of the substrate at block 504. In an embodiment, the plurality of solder tabs can connect the substrate to a printed circuit board and can provide support to all of the substrate. The plurality of solder tabs can be distributed on the bottom surface of the substrate.

At block 506, a second location of a bottom surface of the substrate is determined for a first retention mechanism based on the first location of the first antenna connection. The second location can be directly below the first antenna connection. The first retention mechanism is attached to the bottom surface of the substrate at the second location of the bottom surface at block 508. The first retention mechanism can provide support for the substrate when the first antenna connection is connected to a first antenna.

At block 510, a second antenna connection is attached to the top surface of a substrate at a third location of the top surface. In an embodiment, the second location of the first retention mechanism on the bottom surface is directly below the third location of the second antenna connection. At block 512, a determination is made whether the second location of the first retention mechanism on the bottom surface is directly below the third location of the second antenna connection. If the second location of the first retention mechanism on the bottom surface is directly below the third location of the second antenna connection, the module is completed at block 514. However, if the second location of the first retention mechanism on the bottom surface is not directly below the third location of the second antenna connection, a fourth location on the bottom surface of the substrate is determined for a second retention mechanism based on the third location of the second antenna connection at block 516. The fourth location can be directly below the second antenna connection.

At block 518, the second retention mechanism is attached to the bottom surface of the substrate at the fourth location on the bottom surface, and then the module is completed at block 514. The second retention mechanism can provide support for the substrate when the second antenna connection is connected to a second antenna. The substrate can be a portion of the module configured to provide a primary radio for a wireless device via the first antenna connection and the first antenna.

Although only a few exemplary embodiments have been described in detail above, those skilled in the art will readily appreciate that many modifications are possible in the exemplary embodiments without materially departing from the novel teachings and advantages of the embodiments of the present disclosure. For example, the methods described in the present disclosure can be stored as instructions in a computer readable medium to cause a processor to perform the method. Additionally, the methods described in the present disclosure can be stored as instructions in a non-transitory computer readable medium, such as a hard disk drive, a solid state drive, a flash memory, and the like. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A device comprising:
   a substrate having a top surface and a bottom surface;
   a plurality of solder tabs connected to the bottom surface of the substrate, wherein the solder tabs are configured to provide support to the substrate;
   a first antenna connection mounted directly to the top surface of the substrate, wherein the first antenna connection is configured to connect with a first antenna; and
   a first retention mechanism connected at a first location of the bottom surface of the substrate to provide support for the substrate at the first antenna connection when the first antenna connection is connected to the first antenna, wherein the first location of the first retention mechanism is directly below the first antenna connection.

2. The device of claim 1 further comprising:
   a second antenna connection mounted directly to the top surface of the substrate, wherein the second antenna connection is configured to connect with a second antenna; and
   a second retention mechanism connected to a second location of the bottom surface of the substrate to provide support for the substrate when the second antenna connection is connected to the second antenna, wherein the second location of the second retention mechanism is selected to be directly below the second antenna connection.

3. The device of claim 1 further comprising:
   a second antenna connection mounted directly to the top surface of the substrate, wherein the second antenna connection is configured to connect with a second antenna wherein the first location of the first retention mechanism is selected to be directly below the second antenna connection.

4. The device of claim 3 wherein the first retention is rectangular and extends along the bottom surface of the substrate for a substantially similar distance as a distance of the first antenna connection to the second antenna connection on the top surface of the substrate.

5. The device of claim 1 wherein the first retention mechanism is shaped as an outline of the first antenna connection.

6. The device of claim 1 wherein the first retention mechanism is configured to provide a ground potential for the device.

7. The device of claim 1 wherein the device is configured to provide a primary radio for a wireless device via the first antenna connection and the first antenna.

8. A device comprising:
   a printed circuit board;
   a substrate having a top surface and a bottom surface;
   a plurality of solder tabs connected to the bottom surface of the substrate, wherein the solder tabs are configured to connect the substrate to the printed circuit board and to provide support to the substrate, and wherein the solder tabs are evenly distributed on the bottom surface of the substrate;
   a first antenna connection mounted directly to a first location of the top surface of the substrate, wherein the first antenna connection is configured to connect with a first antenna; and
   a first retention mechanism connected at a second location of the bottom surface of the substrate to provide support for the substrate at the first antenna connection when the first antenna connection is connected to the first antenna, wherein the first location of the first retention mechanism is directly below the first antenna connection.

9. The device of claim 8 further comprising:
   a second antenna connection mounted directly to the top surface of the substrate, wherein the second antenna connection is configured to connect with a second antenna; and
   a second retention mechanism connected to a second location of the bottom surface of the substrate to provide support for the substrate when the second antenna connection is connected to the second antenna, wherein the second location of the second retention mechanism is selected to be directly below the second antenna connection.

10. The device of claim 8 further comprising:
    a second antenna connection mounted directly to the top surface of the substrate, wherein the second antenna connection is configured to connect with a second antenna wherein the first location of the first retention mechanism is selected to be directly below the second antenna connection.

11. The device of claim 10 wherein the first retention is rectangular and extends along the bottom surface of the substrate for a substantially similar distance as a distance of the first antenna connection to the second antenna connection on the top surface of the substrate.

12. The device of claim 8 wherein the first retention mechanism is a crescent shape directly on the opposite side of the substrate as the first antenna connection.

13. The device of claim 8 wherein a stress exerted when the first antenna is connected to the first antenna contention is greater than a normal flex stress on the substrate.

14. The device of claim 8 wherein the device is configured to provide a primary radio for a wireless device via the first antenna connection and the first antenna.

15. A method comprising:
attaching a first antenna connection to a top surface of a substrate at a first location of the top surface;
attaching a plurality of solder tabs to a bottom surface of the substrate, wherein the solder tabs are configured to connect the substrate to a printed circuit board and to provide support to of the substrate, and wherein the solder tabs are evenly distributed on the bottom surface of the substrate;
determining a second location on a bottom surface of the substrate for a first retention mechanism based on the first location of the first antenna connection, wherein the second location is directly below the first antenna connection; and
attaching the first retention mechanism to the bottom surface of the substrate at the second location of the bottom surface, wherein the first retention mechanism is configured to provide support for the substrate at the first location when the first antenna connection is connected to a first antenna.

16. The method of claim 15 father comprising:
attaching a second antenna connection to the top surface of a substrate at a third location of the top surface, wherein the second location of the first retention mechanism on the bottom surface is directly below the third location of the second antenna connection.

17. The method of claim 15 wherein the substrate is a portion of a module configured to provide a primary radio for a wireless device via the first antenna connection and the first antenna.

18. The method of claim 15 further comprising:
attaching a second antenna connection to the top surface of a substrate at a third location of the top surface;
determining a fourth location on the bottom surface of the substrate for a second retention mechanism based on the third location of the second antenna connection, wherein the fourth location is directly below the second antenna connection; and
attaching the second retention mechanism to the bottom surface of the substrate at the fourth location on the bottom surface, wherein the second retention mechanism is configured to provide support for the substrate when the second antenna connection is connected to a second antenna.

19. The method of claim 15 wherein a stress exerted when the first antenna is connected to the first antenna contention is greater than a normal flex stress on the substrate.

20. The method of claim 15 wherein the first retention mechanism is a star burst shape.

* * * * *